United States Patent [19]

Thillays

[11] Patent Number: 4,711,521
[45] Date of Patent: Dec. 8, 1987

[54] METHOD OF MANUFACTURING A TERMINAL DEVICE FOR AN OPTICAL FIBER, AND DEVICE THUS OBTAINED

[75] Inventor: Jacques C. Thillays, Herouville, France

[73] Assignee: U.S. Philips Corporation, New York, N.Y.

[21] Appl. No.: 778,651

[22] Filed: Sep. 23, 1985

[30] Foreign Application Priority Data

Sep. 28, 1984 [FR] France .................. 84 14953

[51] Int. Cl.$^4$ ................... G02B 6/42; G02B 6/32
[52] U.S. Cl. ..................... 350/96.20; 350/96.18
[58] Field of Search ............ 350/96.15, 96.18, 96.20; 357/74

[56] References Cited

U.S. PATENT DOCUMENTS 4,186,995  2/1980  Schumacher ............... 350/96.18 X
4,610,746  9/1986  Broer et al. ................ 350/96.15 X

FOREIGN PATENT DOCUMENTS 0026124  8/1981  European Pat. Off. .
0111263  2/1984  European Pat. Off. .
53-20345  3/1978  Japan .
1508138  7/1978  United Kingdom .

Primary Examiner—Eugene R. LaRoche
Assistant Examiner—Steven J. Mottola
Attorney, Agent, or Firm—Marc D. Schechter

[57] ABSTRACT

A method of manufacturing a terminal device by the steps of locking an afocal system, which is formed by a ball lens and an opto-electronic element, to the bottom of a housing, and centering central aperture of a diaphragm with respect to the ball lens. Subsequently, using a mechanical guiding operation by means of a pin, the micro-component thus formed is positioned with respect to a reference surface of a base. The terminal device thus obtained is capable of receiving an optical fiber in its central aperture without further alignment being required.

14 Claims, 19 Drawing Figures

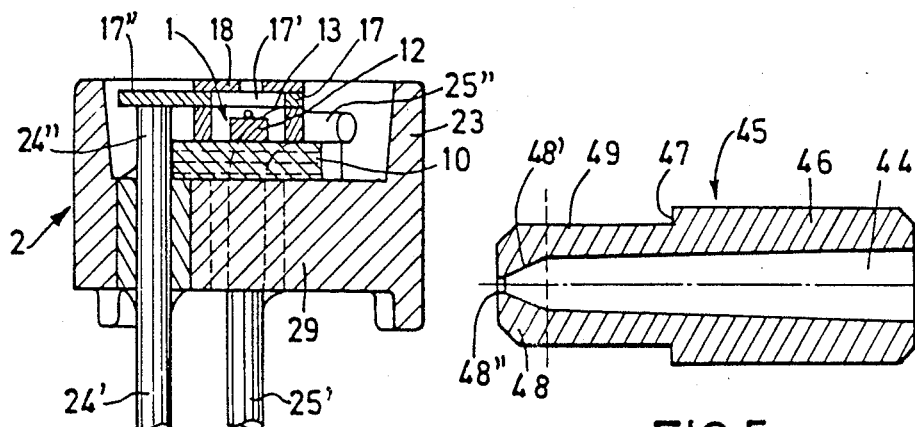
FIG.9a
FIG.5a
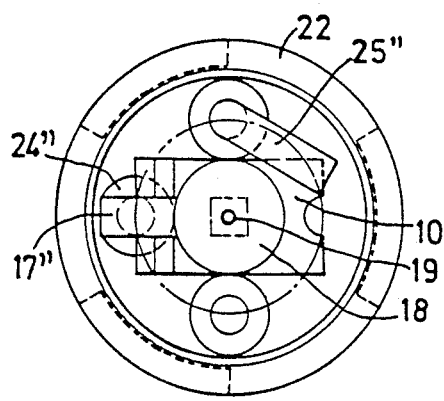
FIG.9b
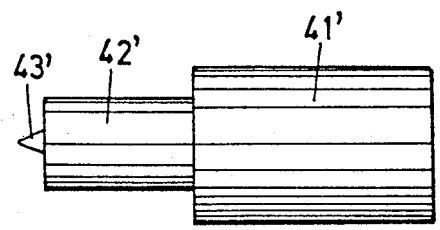
FIG.5b
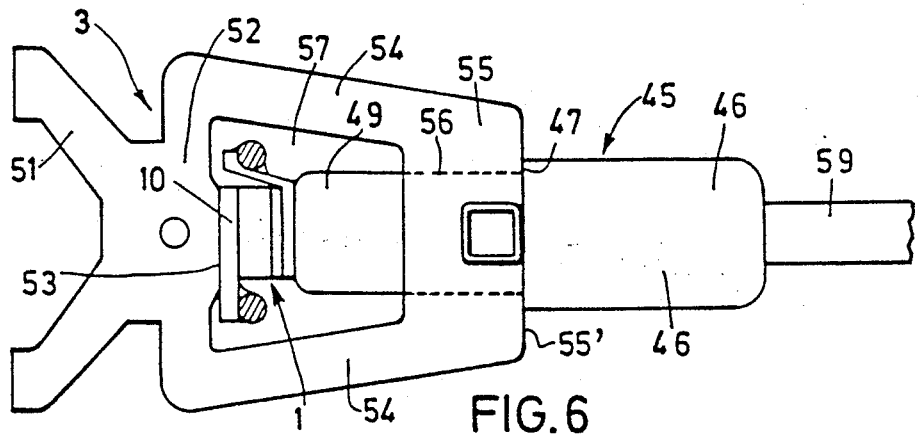
FIG.6

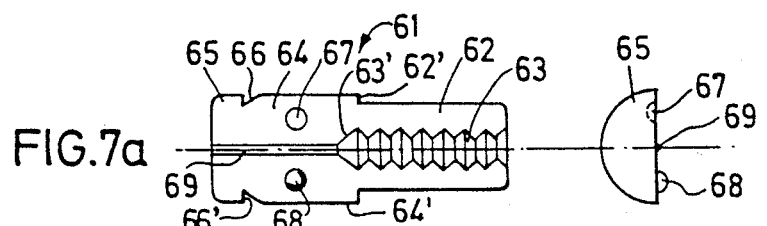
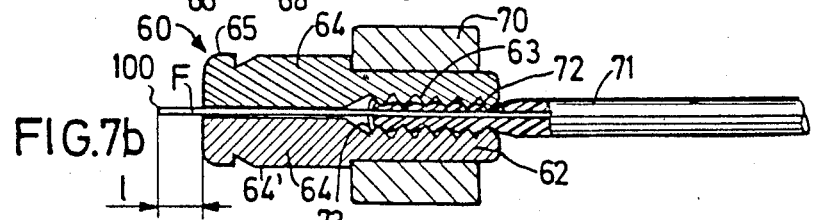
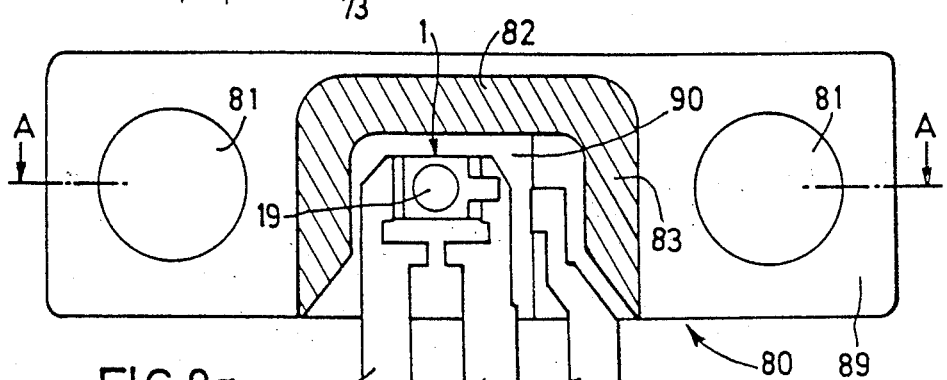
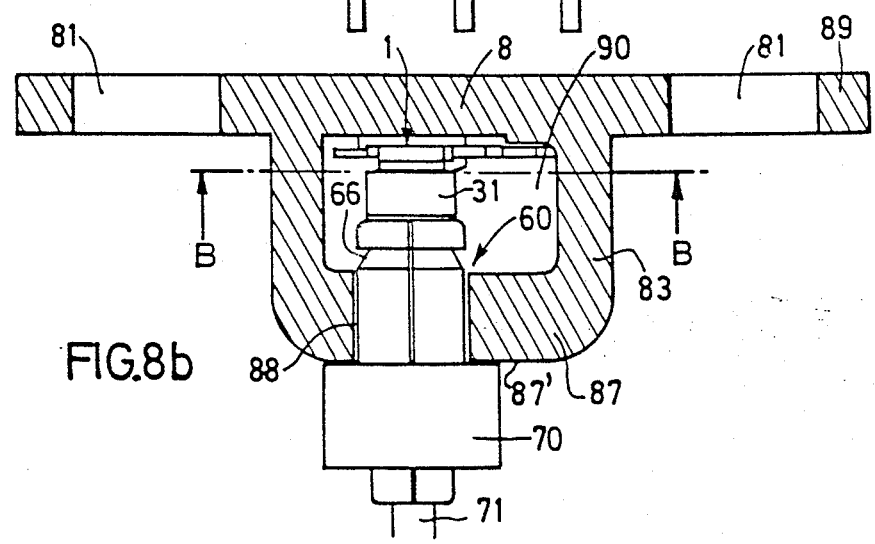

METHOD OF MANUFACTURING A TERMINAL DEVICE FOR AN OPTICAL FIBER, AND DEVICE THUS OBTAINED

BACKGROUND OF THE INVENTION

The invention relates to a method of manufacturing a terminal device for an optical fiber. The method includes the positioning of an opto-electronic semiconductor element in a base, and the securing of a ball lens on the element in order to form an afocal system. The method also includes the making of electrical connections.

A known method of this kind does not enable exact positioning of the ball lens with respect to a reference surface of the base. The optical fiber must therefore be moved in two perpendicular directions in order to make its axis coincide exactly with the optical axis of the afocal system. This is a time-consuming and intricate operation.

SUMMARY OF THE INVENTION

It is an object of the method according to the invention to substantially eliminate these advantages.

The fact that the ball lens is positioned with respect to a reference surface of the base facilitates the mounting of the fiber, because the fiber can be mounted so as to be positioned with respect to a reference contour. The reference contour cooperates, upon introduction of the fiber with the reference surface in such a manner that the fiber is situated substantially opposite the central, calibrated aperture.

Moreover, the steps of the method according to the invention can be comparatively simply performed, by low-cost mass production.

The basic idea of this method consists of positioning the ball lens in two simple steps. The first step involves the ball lens and the central aperture, and the second step involves the central aperture and the reference contour. Such positioning would be difficult to achieve in a single step, considering the relative dimensions of the ball lens and the reference surface.

The central aperture thus has a dual function: (1) it is used for positioning in two steps, and (2) it is used for centering the optical fiber.

The method according to the invention has the following steps:

(a) The assembly formed by the ball lens and the opto-electronic element is secured in position on the bottom of a microhousing.

(b) The central aperture of a diaphgram, supported by a lateral portion of the microhousing, is centered with respect to the ball lens. The central aperture has a diameter which is substantially equal to the outer diameter of an optical fiber and which is larger than that of the ball lens.

(c) The diaphragm thus centered is secured in position, thus forming a mirco-component.

(d) The micro-component is arranged in the base and is positioned with respect to a reference surface thereof by introducing a pin into the central aperture of the diaphragm. The pin itself is positioned with respect to a reference contour which cooperates with the reference surface.

(e) The micro-component thus centered is secured in position.

In a further version of the method according to the invention, the micro-component is secured in position by electrical connection to terminals of the base. The bottom of the micro-housing is then conductive, and the step of securing the opto-electronic element in position is carried out so that this element comes into electrical contact with the conductive bottom. The diaphragm is also electrically conductive and is electrically connected to the opto-electronic element. The diaphragm or a spacer is extended in the direction of the bottom of the micro-housing by a way of a conductive pad. The microcomponent is then secured in position by soldering the conductive bottom and the conductive pad to a first and a second terminal of the base.

In a preferred version of the method in which the component is provided with an abutment for the optical fiber, a spacer whose central portion at least is transparent is preferably arranged between the diaphragm and the lateral portion of the microhousing.

A further version of the invention includes supplementary steps for providing the device with an optical fiber, that is to say a step for introducing the fiber into the central aperture until it abuts against the spacer. This step is performed by a tool which is provided with a truncated conical profile for guiding the fiber. The tool is arranged so as to be substantially coaxial with respect to the central aperture of the diaphragm. The fiber is then locked in the abutting position.

In a first version of the method, the tool is a centering ferrule whose front portion is provided with a truncated conical profile. The centering ferrule is centered by cooperation between the reference surface of the base and a first centering contour for the centering ferrule which is coaxial with the truncated conical profile, so that the latter is guided substantially coaxially with respect to the central aperture of the diaphragm.

The method also includes locking the fiber in position in the centering ferrule, and locking the centering ferrule in an abutting position against the base. These latter steps represent the step of locking the fiber in the abutting position.

In a second version of the method, the tool is formed by a centering member. The method includes a step of introducing a holding ferrule provided with an optical fiber which is locked in position thereon so that its projects from the front portion thereof over a given length. The holding ferrule is centered by cooperation between a second centering contour of the holding ferrule, coaxial with respect to the optical fiber accommodated therein, and the reference surface of the base. The method also includes a step of locking the holding ferrule in position against an abutment, which constitutes the step of locking the fiber in an abutting position.

The invention also relates to a terminal device for an opical fiber which can be obtained by this method and which includes an opto-electronic semiconductor element on which there is secured a ball lens so as to form an afocal system. The assembly formed by the opto-electronic element and ball lens is positioned in a base.

As has already been mentioned, the fiber must be positioned during mounting in the known device. Positioning in two perpendicular directions is a time-consuming and intricate operation.

This problem, is avoided in the terminal device according to the invention. Such a device includes a micro-component which includes a microhousing. On bottom of the microhousing there is secured the assembly formed by the opto-electronic element and the ball lens. A diaphragm is locked in position on a lateral portion of the microhousing in such a manner that it has a central aperture which is coaxial with respect to the ball lens. The diameter of the aperture is larger than the diameter of the ball lens. The micro-component itself is locked in the base in such a manner that the central aperture of the diaphragm is positioned with respect to a reference surface of the base.

In a further embodiment according to the invention, the micro-component is secured to the base by way of conductive connections. To this end, the bottom of the microhousing is in electrical contact with the opto-electronic element. The diaphragm is electrically conductive and is electrically connected to the opto-electronic element. The diaphragm extends in the direction of the microhousing by way of a conductive pad. The conductive bottom and the conductive pad constitute the electrical connections of the microcomponent. The conductive connections can thus be electrically connected to a first and a second conductive terminal of the base so as to ensure at the same time that the microhousing is kept in position on the base.

In a preferred embodiment according to the invention, the device comprises a spacer whose central portion at least is transparent. The spacer is arranged between the diaphragm and the lateral portion of the microhousing so as to serve as an abutment for an optical fiber introduced into the central aperture of the diaphragm when the terminal device is used. The diaphragm may carry the conductive pad.

In a first embodiment of this version, a centering ferrule, whose front portion is provided with a truncated portion, serves as a tool for introducing the optical fiber. To this end, the central portion of the centering ferrule is provided with a centering contour which is coaxial with the truncated conical profile. The contour cooperates with the reference surface of the base in order to guide the truncated conical portion of the centering ferrule so as to be substantially coaxial with the central aperture of the diaphragm, as well as with means for locking the fiber.

In a second embodiment of this version, the introduction of the fiber is facilitated by a centering member having a truncated conical profile. The optical fiber is locked in position on a holding ferrule so that it projects beyond the front portion thereof over a given length. The holding ferrule is provided with a second centering contour which is centered with respect to the optical fiber, thus ensuring the centering of the holding ferrule with respect to the reference surface of the base. The holding ferrule is locked in position against an abutment of the base by appropriate known means.

BRIEF DESCRIPTION OF THE DRAWING

FIGS. 5a, 6 and 5b show a vertical sectional view of centering ferrule according to the invention, component provided with a fiber mounted in such a ferrule, and a jig for mounting the micro-component in the base, respectively.

FIGS. 7a and 7b are a lateral view of one half of a holding ferrule and a vertical sectional view, respectively of a holding ferrule provided with a fiber.

FIGS. 8a and 8b are a horizontal sectional view and a vertical sectional view, respectively, of a device including such a ferrule and utilizing a centering member.

FIGS. 9a and 9b show a further version according to the invention.

DESCRIPTION OF THE PREFERRED EMBODIMENTS

Figure 1A:
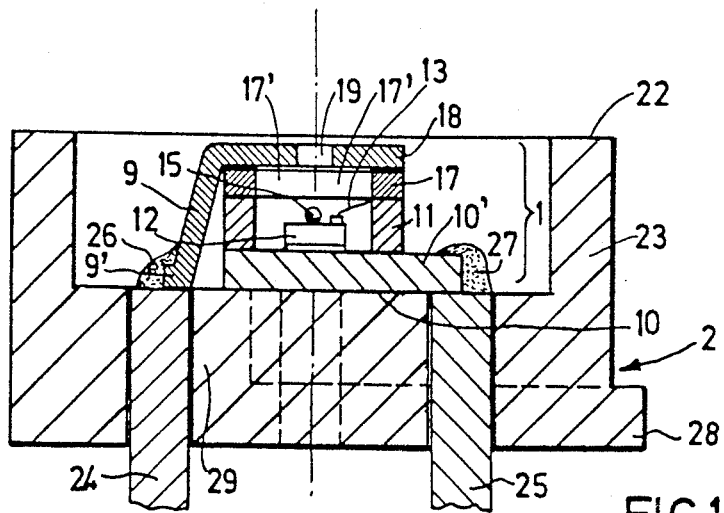
FIGS. 1a and b are a vertical sectional view and a plan view, respectively, of an embodiment of a terminal device according to the invention.
Figure 1B:
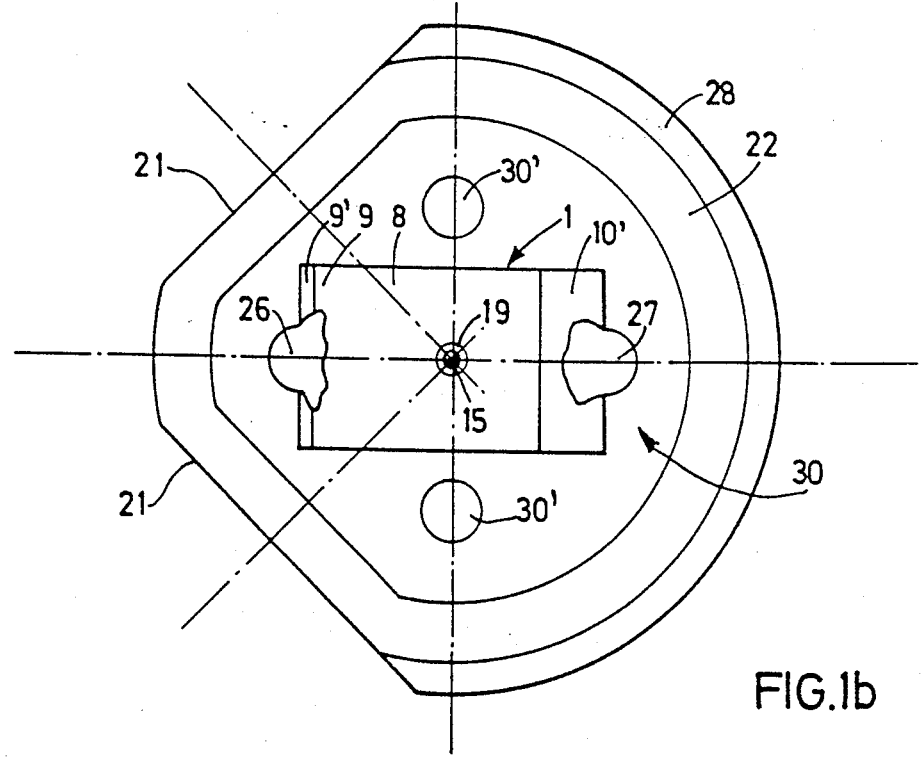

In FIGS. 1a and 1b a micro-component 1 is mounted in a base 2. The micro-component 1 is separately shown in FIG. 2b, and is assembled according to the steps shown in FIGS. 3a and 3b, utilizing the elements shown in FIG. 2a.

The micro-component in FIG. 2 includes a bottom 10, and an annular portion 11 which forms the lateral portion of the microhousing. It also includes a light-emitting or light-receiving semiconductor crystal 12, depending on the desired type of component, a ball lens formed by a glass microsphere 15, and a diaphragm 18 provided with a central aperture 19. Aperture 19 is coaxial with the microsphere 15, and has a diameter substantially equal to the outer diameter of a bare fiber and larger than that of the microsphere 15. In this case, the microcomponent includes a spacer 17 whose central portion 17 is transparent and which can serve as an abutment for the fiber during its mounting.

The presence of this spacer 17 is only optional. Considering the fact that the system is afocal, a considerable tolerance exists as regards the axial arrangement of the fiber; the distance between the fiber and the microsphere 15 is not very important. However, it is to be noted that the spacer 17, used as an abutment or not, offers the advantage of sealing the micro-component.

FIGS 3a-3d show the (non-limitative) example where the diaphragm 18 and the bottom 10 also serve as electrical connections to the component 12. To this end, the periphery of the spacer 17 is conductive and so is the bottom 10. It is to be noted, however, that the annular portion 11 is an insulator.

Figure 3A:
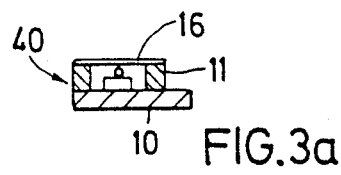
FIGS. 3a to 3d illustrate the steps for manufacturing the device shown in FIGS. 1a and 1b.
Figure 2A:
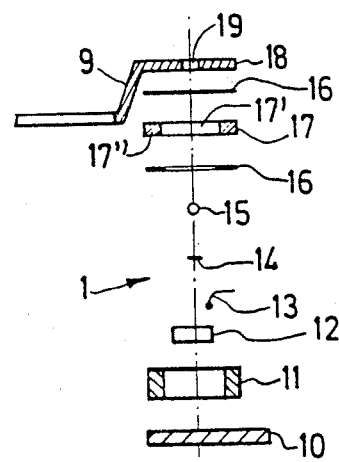
FIGS. 2a and 2b are cross-sectional views of the parts constituting the micro-component before and after assembly, respectively.
Figure 3D:
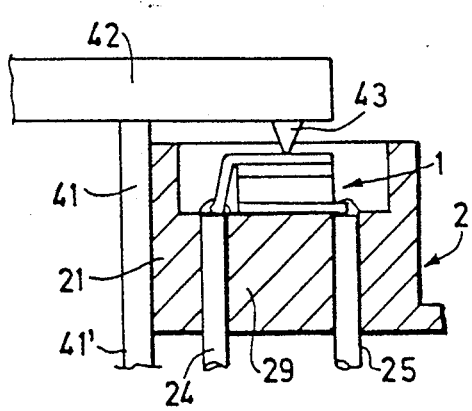
Figure 2B:
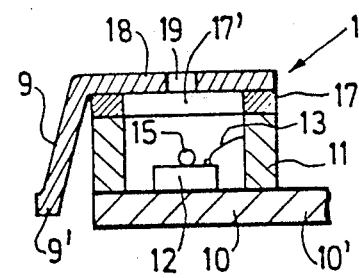

The annular portion 11 in FIG. 3a is glued to the bottom 10, and the crystal 12 is soldered or brazed to the center of the bottom 10 after glueing of the microsphere 15 by means of polyimide glue 14 (FIG. 2a). It is to be noted that the centering of the crystal 12 and the annular portion 11 does not require special precision.

Figure 3B:
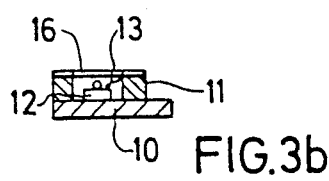
Figure 3C:
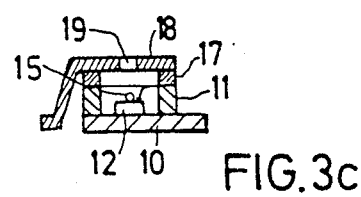

The annular portion 11 in FIG. 3b is covered by an annular perform 16. One end of an electrical connection wire is soldered or brazed to the crystal 12, and its other end is connected to the preform 16 and thus to the periphery of the spacer 17 (FIG. 3c). The diaphragm 18 is positioned so that its aperture 19 is concentric with the microsphere 15, and then it is fastened to spacer 17, thus forming the micro-component.

This centering operation can be readily carried out with a precision of more than 10 microns underneath a microscope or binoculars because of the fact that the microsphere 15 and the aperture 19 have a diameter of the same order of magnitude: 80 to 100 microns for the microsphere (i.e. a diameter substantially larger than that of the core of a fiber) and 200 microns for the aperture 19 (which is, for example, on the order of magnitude of the external nominal diameter (185 microns) of a bare fiber). The microsphere 15 has a diameter which is in any case smaller than that of the aperture 19.

During the last operation (FIG. 3d) the micro-component is arranged in the base and is locked in position therein so that it is positioned with respect to a reference surface thereof, for example with a precision on the order of magnitude of from 1 to 20 microns. In the case illustrated by FIGS. 1a and 1b, this reference surface is formed in known manner by two protruding profiles 21 which define a V.

The positioning of the micro-component is performed in a jig which includes an arm 42 with a centering pin 43. Pin 43 is preferably a truncated cone. The position of pin 43 is determined with respect to a calibration surface 41' provided in a vertical portion 41 of the jig and corresponding to the reference surface of the micro-component.

The micro-component is positioned as follows. The reference surface, in this case two protruding profiles 21 in the form of a V, is brought into contact with the calibration surface 41', which is in this case formed by two V-grooves. The base 2 is slid along the calibration surface 41' in the direction of the arm 42. Once the micro-component 1 has been approximately centered, which is simple because of the fact that the aperture 19 has a diameter of approximately 0.2 mm, the truncated conical centering pin 43 is inserted into the central aperture 19. The base 2 is further slid until the pin 43 abuts aperture 19 because of the pin's increasing circumference. High-precision positioning can thus be obtained (precision on the order of magnitude of 10 microns). It subsequently suffices to lock the position of the micro-component 1 in the base 2 by means of glue or any other means. In the present example the manufacture is simplified by the fact that the soldering of the electrical connections at the same time locks the microcomponent 1 in place.

As appears from FIGS. 1a and 1b, the base 2 includes a portion 29. Stepped portion 28 is provided with a stepped portion 28 which forms an abutment, a lateral wall 23, an upper surface 22, a cavity 30 and the two V-shaped profiles 21. The micro-component 1 is arranged in the cavity 30. Two conductive terminals 24 and 25 traverse the base portion 29 and are flush with the bottom of the cavity 30. The brazing of the conductive connections of the micro-component is performed by way of a conductive pad 9 which extends the diaphragm 18 in the direction of. The bottom 10 and which is provided with a folded end 9' the pad 9 is brazed to the terminal 24 at the fold 9'. The bottom 10 is provided with an extension 10' which allows for the bottom to be brazed to the terminal 25 at the area 27.

Figure 4A:
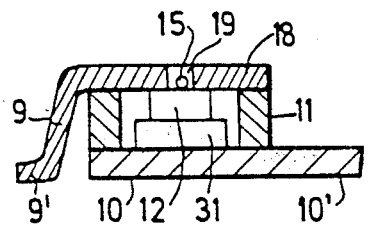
FIG. 4a is a cross-sectional view of a version of a micro-component according to the invention without a transparent spacer which forms the abutment for the fiber.

The micro-component in FIG. 4a does not comprise a spacer 17. The opto-electronic element 12 is raised by a conductive support 31 so that its surface is flush with the plane of the upper surface of the annular portion 11. The diaphragm 18 thus directly electrically contacts the surface of the element 12. A conductive paste is used to ensure suitable contact.

Figure 4B:
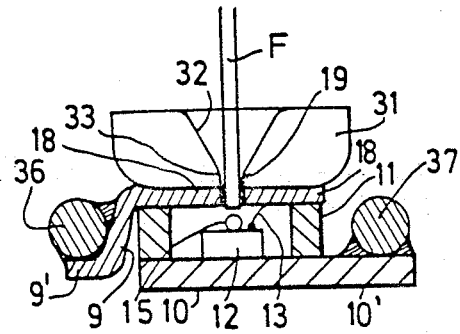
FIG. 4b shows the mounting of a fiber with the aid of a centering member.

FIG. 4b illustrates the positioning of a fiber F by means of a centering tool 31. Tool 31 is provided with a truncated conical profile which is preferably extended into a cylindrical end portion 33 having the same nominal diameter as the aperture 19. It is to be noted that the micro-component is the same as that shown in FIG. 2b, except that the spacer 17 is absent and that it is locked in position not by means of electrical connections, but for example by glueing to the bottom 10 or by mechanical locking. The connections are a wire 37 which is brazed to the extension 10' of the bottom 10 and a wire 36 which is brazed to the concave portion of the pad 9.

In FIGS. 5a and 6, the fiber is centered by way of a centering ferrule 45. The front portion 48 of ferrule 45 is provided with a truncated conical profile 48' which is preferably extended into a cylindrical end portion 48" having the same nominal diameter as the aperture 19. The truncated conical profile 48' and the end portion 48" are coaxial with a central cylindrical portion 49. Between its rear portion and the profile 48', the centering ferrule 45 has a truncated conical profile 44 with a small angle of aperture, thus facilitating the guiding of the end of the bare fiber F (that is to say the fiber provided only with its optical sheath which projects from its mechanical protection sheath 59), as well the guiding of this protection sheath.

The base 3 comprises a pedestal 52. Cooling fins 51 are preferably connected to pedestal 52. An flat portion 53 is provided for accomodating the bottom 10 of the micro-component 1. The pedestal 52 is extended at each side and in the direction opposite that of the fins by two lateral walls 54 which join at a rear portion 55.

The reference surface of the base 3 is formed by a bore 56 which cooperates with the central cylindrical portion 49 of the ferrule so that the axis of the truncated profile 48' and, as the case may be, the cylindrical extremity 48" extends through the center of the microsphere 15. The rear portion 46 of the ferrule 45 has a diameter which is larger than that of the central portion 49 thereof, so that it abuts against the surface 55' of the base 3 due to the stepped portion 47. The length of the central portion 49, of the front portion 48 and the thickness of the micro-component 1 are calculated so as to form a stock from the stepped portion 47 abutting against the surface 55' to the flat portion 53. The ferrule 45 is locked in its abutting position by means not shown (glueing, ring etc.), after which the fiber F is introduced into the ferrule 45. If required the fiber F may be secured in the ferrule 45 by a suitable means which consists of, for example, an adhesive introduced into the truncated profile 44.

FIG. 5b shows a jig for positioning the micro-component 1 on the flat portion 53. It comprises a cylindrical rear portion 41' having a nominal diameter with is equal to that of the bore 56 which tolerances enabling portion 41' to slide in bore 56 with very little play. The jig further includes a cylindrical front section 42' which has a smaller diameter and which supports a truncated centering pin 43'. Pin 43' is very accurately coaxial with the cylindrical section 41'.

In FIGS. 7a, 7b, 8a, and 8b, a holding ferrule 60 is provided so that the bare fiber F is locked in position and projects over a well-defined length from the front portion 65. This embodiment is advantageous when no transparent spacer 17 is used.

As appears from FIG. 7a, the holding ferrule 60 is made of two identical semi-cylinders 61 which are preferably molded. Each semi-cylinder 61 comprises a groove 69, for example a V-groove, which positions the bare fiber F in the axial direction without compressing it. The groove 69 extends from a front portion 65 an opens into a ribbed groove 63 via a truncated conical section 63' which guides the fiber F after introduction.

The central portion 64 of ferrule 60 meets the front portion 65 via a groove 66 which forms a shoulder 66'. Central portion 64 meets the rear portion 62 via a shoulder 62' which serves as an abutment for a ring 70. The central portion 64 also comprises semi-cylindrical blind hole 67 and a projection 68 which are situated one on each side of the axis of the groove 69 and which also guide the two halves of ferrule 60.

In FIG. 7b the assembled holding ferrule 60 is held by the ring 70 which abuts against the shoulder 62'. The ring 70 is forced over the exterior of the cylindrical rear portion 62 or is screwed thereon. The front portion 72 of the sheath 71 of the optical fiber cable is locked in the ribbed grooves 63, and the bare optical fiber F is guided by the grooves 69 and projects from the front portion 65 over a given length.

The base 80 in FIGS. 8a and 8b is provided with a micro-component 1 which is mounted on a pedestal 89. Pedestal 89 has two bores 81 for securing the base on a support. A vertical wall 82 and two vertical wings 83, which extend perpendicularly thereto, enclose the micro-component on three sides. The fourth side remains free in order to allow for the passage of the electrical connections 84, 85 and 86, as well as to enable filling (if necessary) with resin.

The two wings 83 and the wall 82 are capped by an upper plate 87. Plate 87 extends parallel to the pedestal 89, and comprises a bore 88 having a nominal diameter which is equal to that of the central portion 64 of ferrule 60 so that ferrule 60 can be slid in bore 88 with little play. A centering member 31 (see FIG. 4b) enables the introduction of the bare fiber F into the aperture 19 of the micro-component 1.

The length 1 (FIG. 7b) of fiber F extending from ferrule 60 is chosen so that when the ring 70, itself abutting against the shoulder 62', abuts against the upper surface 87' of the upper plate 87, the front end 100 of the bare fiber F is situated near the microsphere 15 or the transparent spacer 17.

For the various examples described above it follows that the centering of the central aperture 19 with respect to the microsphere 15 must be accurate as possible, because it determines the coaxiality of the fiber F and the optical axis of the assembly formed by the microsphere 15 and the opto-electronic element 12. The positioning of the central aperture 19 with respect to the reference surface of the base can be less precise, but should be sufficient to enable the insertion of the fiber with the aid of a truncated conical contour.

In FIGS. 9a and 9b, the spacer 17 is made (with the exception of its central transparent portion 17') of a conductive material and is extended by way of a pad 17". Pad 7" establishes electrical contact with an extension 24" of a conductive terminal 24' of the base 2. The spacer 17 is electrically connected to an electrode of the element 12 via the wire 13. On the other hand, the base 10 of the micro-component 1 electrically contacts a bent extension 25" of a terminal 25' of the base 2.

What is claimed is:

1. A method of manufacturing a terminal device for an optical fiber, including the positioning of an opto-electronic semiconductor element in a base, a ball lens being secured on said element in order to form an afocal system, as well as the making of electrical connections, characterized in that it includes the following steps:
   (a) securing an assembly formed by the ball lens (15) and the opto-electronic element (12) in position on the bottom (10) of a microhousing (40);
   (b) centering a central aperture (19) of a diaphragm (18) with respect to the ball lens (15), said diaphragm being supported by a lateral portion (11) of the microhousing, said central aperture having a diameter which is substantially equal to the outer diameter of an optical fiber (F) and which is larger than that of the ball lens (15);
   (c) securing said diaphragm (18) thus centered in position, thus forming a micro-component (1);
   (d) arranging the micro-component in said base (2, 3, 80) and positioning it with respect to a reference surface (21, 56, 88) thereof by introducing a pin (43) into said central aperture (19) of the diaphragm (18), said pin (43) itself being positioned with respect to a reference contour (41) which cooperates with the reference surface (21, 56, 88);
   (e) securing the micro-component (1) thus centered in position in the base (2).

2. A method as claimed in claim 1, characterized in that it comprises a step for interposing, between the diaphragm and the lateral portion (11) of the microhousing (40), a spacer (17) whose central portion (17') at least is transparent and which serves as an abutment for an optical fiber (F) introduced in the central aperture (19) of the diaphragm (18) when the terminal device is used.

3. A method as claimed in claim 2, characterized in that the bottom (10) of the microhousing (40) is electrically conductive, the step involving the securing in position of the opto-electronic element (12) being such that the latter is in electrical contact with said conductive bottom (10), the spacer (17) also being electrically conductive so that it can be electrically connected to the opto-electronic element (12) and being extended by a conductive pad (9, 9'), the securing in position of the miro-component (12) then being achieved by soldering the conductive bottom (10) and the conductive pad (9, 9') to a first (24) and a second (25) conductive terminal of the base (2).

4. A method as claimed in claim 3, for providing a terminal device including, an optical fiber (F), characterized in that it includes a step for introducing the fiber (F) into the central aperture (19) until it abuts against the spacer (17), said step being performed by means of an introductory tool (31, 45) which has a truncated conical profile (37, 48) for guiding the fiber (F) and which is arranged so as to be substantially coaxial with the central aperture (19) of the diaphragm (18), and in that it also includes a step for locking the fiber (F) in the abutting position.

5. A method as claimed in claim 4, characterized in that said introductory tool is formed by a centering ferrule (45) whose front portion is provided with said truncated conical profile (48), and in that during a step for introducing the centering ferrule (45), the ferrule is centered by cooperation between a reference surface (56) of the base and a first centering contour (49) of the centering ferrule (45) which is coaxial with said truncated conical profile (48) so that the latter is guided substantially coaxially with respect to the central aperture (19) of the diaphragm (18), said method also comprising a step for locking the fiber (F) in position in the centering ferrule (45) and a step for locking the centering ferrule (45) on the base (3), these steps representing the said step for locking the fiber in the abutting position.

6. A method as claimed in claim 4, characterized in that said introductory tool is formed by a centering member (31), the method including a step for introducing a holding ferrule (60) provided with an optical fiber (F) which is locked in position (63, 72) thereon so that it projects from a front portion (65) thereof over a given length (l), the holding ferrule being centered by cooperation between a second centering contour (64') of the holding ferrule (60), being coaxial with said optical fiber (F) contained therein, and the reference surface (88) of the base (3), the method also including a step for locking the holding ferrule (60) in position against an abutment (87') this step representing said step for holding the fiber in an abutting position.

7. A terminal device for an optical fiber, comprising an opto-electronic semiconductor element on which there is secured a ball lens so as to form an afocal system, an assembly formed by the opto-electronic element and the ball lens being positioned in a base, characterized in that the device comprises a micro-component (1) which includes a microhousing (40) on the bottom (10) of which there is secured the assembly formed by the opto-electronic element (12) and the ball lens (15), and a diaphragm (18) which is secured in position on a lateral portion (11) of the microhousing (40) so that it presents a central aperture (19) which is coaxial with the ball lens (15) and which has a diameter which is larger than the diameter thereof, the micro-component (1) itself being secured in said base (2, 3, 80) so that the central aperture (19) of the diaphragm (18) is positioned with respect to a reference surface of the base (2, 3, 80), and characterized in that the device includes a spacer (17) whose central portion at least is transparent and which is arranged between the diaphragm (18) and the lateral portion (11) of the microhousing (40) so that it serves as an abutment for an optical fiber (F) introduced into the central aperture (19) of the diaphragm (18) when the terminal device is used.

8. A terminal device as claimed in claim 7, characterized in that the bottom (10) of the microhousing (40) is in electrical contact with the opto-electronic element (12), the a spacer (17) being electrically conductive so that it can be electrically connected to the opto-electronic element (12) and being extended by way of a conductive pad (9, 9'), the conductive bottom (10) and the conductive pad (9, 9') constituting the electrical connections of the micro-component (1).

9. A terminal device as claimed in claim 8, characterized in that said conductive connections are electrically connected to a first (24) and a second (25) conductive terminal of the base (2) so that they at the same time ensure that the microhousing (40) is maintained in position on the base (2).

10. A terminal device as claimed in any one of the claims 8 or 10 and provided with an optical fiber, characterized in that it includes an introductory tool for the optical fiber which is formed by a centering ferrule (45) whose front portion (48') has a truncated conical profile (48), its central portion (49) having a centering contour (49') which is coaxial with the truncated conical profile (48) and which cooperates with the reference surface (56) of the base in order to guide the truncated conical portion (48) of the centering ferrule (45) so as to be substantially coaxial with the central aperture (19) of the diaphragm (18) and also includes means (57) for locking the fiber.

11. A terminal device as claimed in claim 9 and provided with an optical fiber, characterized in that it includes a centering member (31) having a truncated conical profile (32), a holding ferrule (60) provided with an optical fiber (F) which is locked in position (63, 72) thereon so that it projects from the front portion (65) thereof over a given length (l), the holding ferrule (61) being centered by cooperation between a second centering contour (64') of the holding ferrule (60), centered with respect to said optical fiber (F) contained therein, and the reference surface (88) of the base, and in that it includes means (90) for locking the holding ferrule (60) against an abutment (87) of the base (80).

12. A method for manufacturing a termination for an optical fiber, said optical fiber having an outer diameter, said method comprising the steps of:
   providing an opto-electronic element;
   securing a ball lens on the opto-electronic element, said ball lens having a diameter, said opto-electronic element and ball lens forming an opto-electronic assembly having an optical axis;
   securing the opto-electronic assembly in a microhousing;
   arranging a diaphragm on the microhousing opposite the opto-electronic assembly, said diaphragm having a central aperture with a diameter substantially equal to the outer diameter of the optical fiber and larger than the diameter of the ball lens;
   centering the central aperture of the diaphragm on the optical axis;
   securing the centered diaphragm to the microhousing, said opto-electronic assembly, microhousing, and diaphragm forming a microcomponent;
   arranging the microcomponent on a base having a reference surface;
   positioning a pin with respect to the reference surface of the base;
   positioning the microcomponent on the base by inserting the pin into the central aperture in the diaphragm; and
   securing the positioned microcomponent to the base.

13. A termination for an optical fiber, said termination comprising:
   a microhousing;
   an opto-electronic element in the microhousing;
   a ball lens arranged on the opto-electronic element, said ball lens having a diameter, said opto-electronic element and ball lens forming an opto-electronic assembly having an optical axis;
   a diaphragm having a central aperture with a diameter larger than the diameter of the ball lens, said diaphragm being arranged on the microhousing opposite the opto-electronic assembly with the aperture centered on the optical axis;
   a spacer arranged on the microhousing between the diaphragm and the ball lens, said spacer having a central transparent portion arranged between the central aperture and the ball lens, said microhousing, opto-electronic assembly, spacer and diaphragm forming a microcomponent; and
   a base having a reference surface, said microcomponent being arranged on the base with the central aperture accurately positioned with respect to the reference surface.

14. A termination for an optical fiber, said termination comprising:
   a microhousing;
   an opto-electronic element in the microhousing;
   a ball lens arranged on the opto-electronic element, said ball lens having a diameter, said opto-electronic element and ball lens forming an opto-electronic assembly having an optical axis;

a diaphragm having a central aperture with a minimum diameter larger than the diameter of the ball lens, said diaphragm being arranged on the microhousing opposite the opto-electronic assembly with the aperture centered on the optical axis, said microhousing, opto-electronic assembly, and diaphragm forming a microcomponent; and a base having a reference surface, said microcomponent being arranged on the base with the central aperture accurately positioned with respect to the reference surface.

* * * * *